United States Patent
Rince et al.

(10) Patent No.: US 10,841,016 B2
(45) Date of Patent: Nov. 17, 2020

(54) APPARATUSES AND METHODS INVOLVING INDEPENDENT MODULATIONS OF A DIGITAL CLOCK SIGNAL FOR DIFFERENT FREQUENCY DOMAINS

(71) Applicant: NXP USA, INC., Austin, TX (US)

(72) Inventors: Jean-Christophe Patrick Rince, Toulouse (FR); Pascal Kamel Abouda, Toulouse (FR); Domenico Desposito, Toulouse (FR)

(73) Assignee: NXP USA, Inc., Austin, TX (US)

( * ) Notice: Subject to any disclaimer, the term of this patent is extended or adjusted under 35 U.S.C. 154(b) by 137 days.

(21) Appl. No.: 16/284,469

(22) Filed: Feb. 25, 2019

(65) Prior Publication Data
US 2020/0220626 A1 Jul. 9, 2020

(30) Foreign Application Priority Data
Jan. 9, 2019 (EP) .................................... 19305030

(51) Int. Cl.
*H04B 15/00* (2006.01)
*H04B 1/69* (2011.01)
(52) U.S. Cl.
CPC ............... *H04B 15/00* (2013.01); *H04B 1/69* (2013.01)
(58) Field of Classification Search
CPC .......... H04B 15/00; H04B 1/69; H03C 3/095; H03K 3/013
USPC ....................................................... 375/130
See application file for complete search history.

(56) References Cited

U.S. PATENT DOCUMENTS

| 4,739,288 | A | 4/1988 | Ide et al. |
| 5,325,399 | A | 6/1994 | Haspeslagh et al. |
| 6,400,821 | B1* | 6/2002 | Burgan ..................... G10H 1/12 |
| | | | 379/357.03 |
| 6,563,448 | B1* | 5/2003 | Fontaine ............ H03H 17/0642 |
| | | | 341/143 |
| 7,436,235 | B2 | 10/2008 | Nandy |
| 2007/0216380 | A1* | 9/2007 | Hack ........................ G08B 5/36 |
| | | | 323/269 |

(Continued)

FOREIGN PATENT DOCUMENTS

| CN | 105068055 A | 11/2015 |
| DE | 19802065 A1 | 7/1999 |

(Continued)

*Primary Examiner* — Michael R Neff

(57) ABSTRACT

An example apparatus that employs circuitry operating in response to digital clock signal circuitry. The apparatus includes first circuitry and second circuitry. The first circuitry produces a high-frequency digital clock signal characterized by a high frequency which carries radiative noise interference and by a modulated low-frequency digital clock signal characterized by a low frequency modulated by a first type of modulation. The second circuitry produces another low-frequency digital clock signal by combining a disparate modulation signal and a feedback signal derived from the other low-frequency digital clock signal, wherein the disparate modulation signal is characterized by modulating the feedback signal via a second type of modulation that is independent of the first type of modulation and by cancellation/blocking of the radiative noise interference manifested by the circuitry operating in response to the digital clock signal circuitry.

20 Claims, 9 Drawing Sheets

(56) References Cited

U.S. PATENT DOCUMENTS

| | | |
|---|---|---|
| 2007/0216488 A1 | 9/2007 | Kultgen |
| 2008/0159447 A1* | 7/2008 | Bucknor ................ H04B 15/04 |
| | | 375/346 |
| 2009/0115466 A1 | 5/2009 | Maeda |
| 2011/0006817 A1 | 1/2011 | Han et al. |
| 2015/0160687 A1* | 6/2015 | Ciesla ....................... G06F 1/08 |
| | | 713/500 |

FOREIGN PATENT DOCUMENTS

| | | |
|---|---|---|
| DE | 103956996 A | 7/2014 |
| EP | 1184961 A1 | 3/2002 |

\* cited by examiner

APPARATUSES AND METHODS INVOLVING INDEPENDENT MODULATIONS OF A DIGITAL CLOCK SIGNAL FOR DIFFERENT FREQUENCY DOMAINS

Aspects of various embodiments are directed to apparatuses and methods involving independently modulating a digital clock signal for different frequency domains.

Spread spectrum topology can be used to reduce emissions in analog mixed signals. In many instances, a high frequency domain is modulated, which can result in noise in the low frequency domain.

These and other matters have presented challenges to efficiencies of modulating digital clock signal implementations, for a variety of applications.

SUMMARY

Various example embodiments are directed to issues such as those addressed above and/or others which may become apparent from the following disclosure concerning independent modulation of a main clock signal for different frequency domains.

In certain example embodiments, aspects of the present disclosure involve independent modulation of a digital clock signal for two or more different frequency domains using digital divider circuitry and modulation circuitry.

In a more specific example embodiment, an apparatus includes first circuitry and second circuitry. The apparatus employs circuitry that operates in response to digital clock signal circuitry. The first circuitry produces a high-frequency digital clock signal characterized by a high frequency which carries radiative noise interference and by a modulated low-frequency digital clock signal characterized by a low frequency modulated by a first type of modulation. The second circuitry produces another low-frequency digital clock signal by combining a disparate modulation signal and a feedback signal derived from the other low-frequency digital clock signal, wherein the disparate modulation signal is characterized by modulating the feedback signal via a second type of modulation that is (sufficiently) independent of the first type of modulation and by cancellation and/or blocking of the radiative noise interference manifested by the circuitry operating in response to digital clock signal circuitry (e.g., in the other low-frequency digital clock signal).

The first circuitry and the second circuitry can improve electromagnetic compatibility (EMC) in both high and low frequency domains (e.g., above and below 1 MHz) by spreading dynamic current on both DC/DC switching and digital switching and thus reducing peak currents, thereby facilitating efficiency of clock modulation associated with both modulations of a main clock and of divided portion of the main clock. For example, the first circuitry and second circuitry use the main clock signal to produce the high-frequency digital clock signal and the other low-frequency digital clock signal having independent modulation schemes, such as providing independent clock modulation of the main clock. In a number of embodiments, the first circuitry includes a pseudo-random modulator and a frequency modulation (FM) oscillator that produce the high-frequency digital clock signal as a function of the pseudo-random modulator. The high-frequency digital clock signal can be produced as a function of pseudo-random frequency modulation and based on at least four to five percent of the average non-modulated frequency of the main clock and/or at least twelve to sixteen steps. In related or other embodiments the second circuitry includes a triangular modulator and frequency divider circuitry that produces the other low-frequency digital clock signal as a function of the disparate modulation signal.

In a number of specific embodiments, the apparatus further includes additional circuitry. For example, the apparatus includes the circuitry that operates in response to the digital clock signal circuitry. Additionally, the apparatus can further include a power circuit operating by a battery, wherein the power circuit contributes to the radiative noise interference. In various embodiments and/or in addition, the apparatus includes a third circuitry the produces an additional low-frequency digital clock signal by combining another disparate modulation signal and another feedback signal derived from the additional low-frequency digital clock signal. The other disparate modulation signal is characterized by modulating the other feedback signal via another type of modulation that is independent of the first type of modulation (and, optionally, of the second type of modulation) and by cancellation of the radiative noise interference in the additional lower-frequency digital clock signal as produced by the third circuitry.

Other specific example embodiments are direct to a method involving an apparatus employing circuitry operating in response to digital clock signal circuitry. An example method includes producing, via first circuitry of the apparatus, a high-frequency digital clock signal characterized by a high frequency which carries radiative noise interference and by a modulated low-frequency signal characterized by a low frequency modulated by a first type of modulation. The method further includes producing, via second circuitry of the apparatus, another low-frequency digital clock signal by combining a disparate modulation signal and a feedback signal derived from the other low-frequency digital clock signal, wherein the disparate modulation signal is characterized by modulating the feedback signal via a second type of modulation that is independent of the first type of modulation and by cancellation and/or blocking of the radiative noise interference manifested by the circuitry operating in response to the digital clock signal circuitry. As previously described, the other low-frequency digital clock signal is produced as a function of the disparate modulation signal, for example, by spreading dynamic current on both DC/DC switching and digital switching, thereby reducing peak currents and facilitating efficiency of clock modulation associated with both modulations of main clock and of divided portion of the main clock.

In a number of specific embodiments, the method further includes producing, by a third circuitry of the apparatus, an additional low-frequency digital clock signal by combining another disparate modulation signal and another feedback signal derived from the additional low-frequency digital clock signal. The other disparate modulation signal is characterized by modulating the other feedback signal via another type of modulation that is independent of the first and second type of modulation and cancels and/or blocks the radiative noise interference in the additional low-frequency digital clock signal as produced by the third circuitry.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
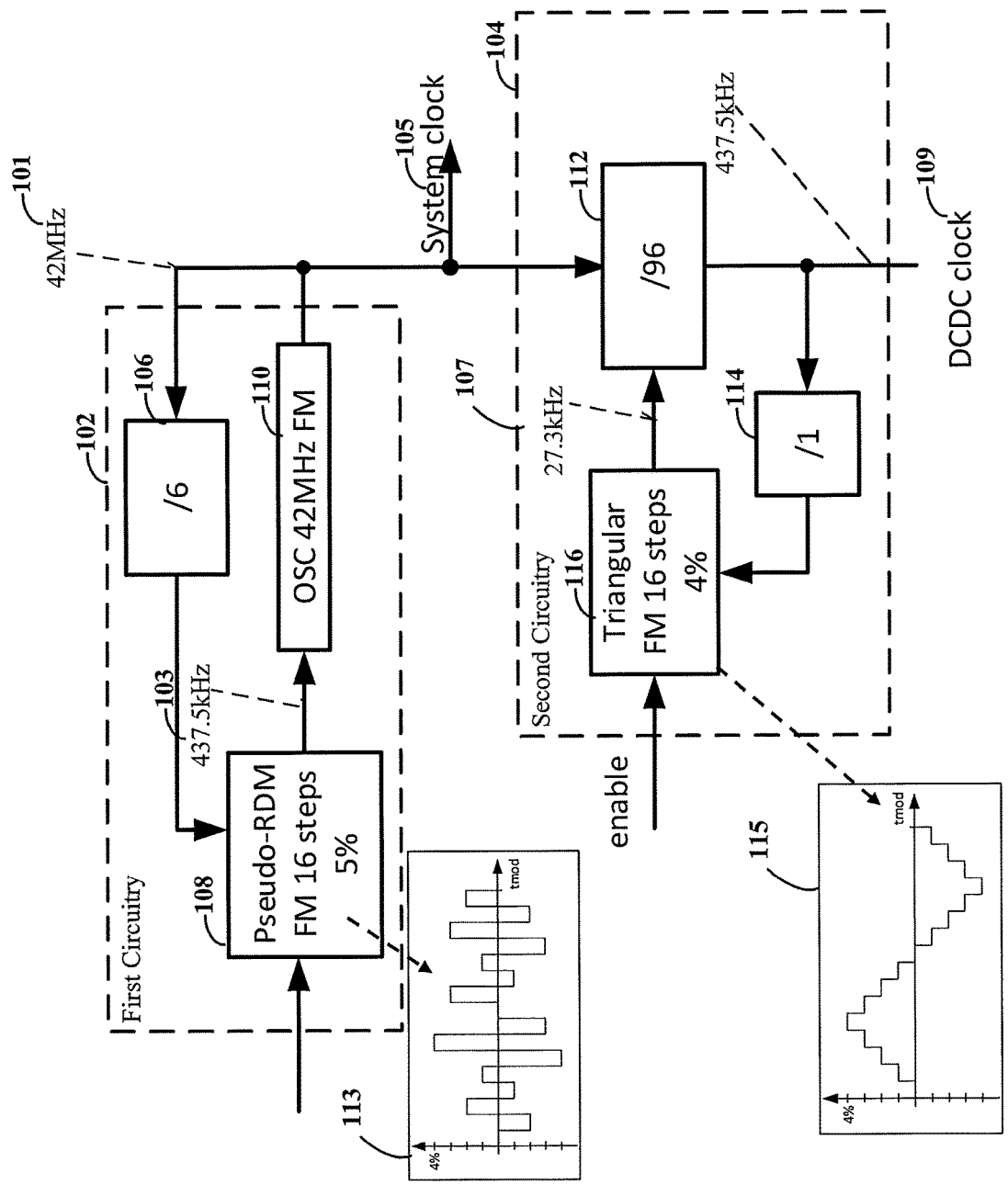
FIG. 1 illustrates an example apparatus, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving apparatuses that differently modulate a main digital clock signal. In certain implementations, aspects of the present disclosure have been shown to be beneficial when used in the context of differently modulating a main digital clock signal between two or more different frequency domains. In some embodiments, electromagnetic compatibility (EMC) is improved in both the high and low frequency domain by spreading dynamic current on both direct current (DC)/DC switching and digital switching generated from the main digital clock signal. While not necessarily so limited, various aspects may be appreciated through the following discussion of non-limiting examples which use exemplary contexts.

In the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various apparatuses employ circuitry that operates in response to digital clock signal circuitry which can manifest radiate noise interference, such as logic circuitry. With improvements in logic circuitry, based on reduced power levels, higher operational speeds, and reduced real estate, it can be difficult to control and/or limit radiative noise interference that inherently gets into the logic circuitry via the digital clock signal and the interconnected DC supply busses. Spread spectrum topologies are sometimes used to reduce emissions in such logic circuitry, such as analog mixed signals. Such topologies can include modulation circuitry and oscillator circuitry used to modulate the clock signal for the high-frequency domain. For example, the modulation frequency can be efficient for 42 MHz and above and can be higher than 120 KHz, which is the resolution bandwidth of a receiver in the frequency band between 30 MHz and 1 GHz to the EMC standard. In such specific examples and assuming 200 KHz modulation frequency to take into account process and temperature variation of the system oscillator, the low-frequency domain (e.g., around 400 kHz) may not be modulated and can generate radiative noise interference. Apparatuses in accordance with the present disclosure block or cancel the radiative noise interference manifested by the circuitry via independent modulation of different frequency digital clock signals. The different modulations are independent of one another. For example, the apparatus modulates the main digital clock in the high frequency domain and uses digital divider circuitry to filter it. The apparatuses use further digital diverter circuitry to provide low frequency domain modulation of the main digital clock. Embodiments are not limited to two frequency domains, and can include additional modulation and domains. Such embodiments improve the efficiency of the clock modulation and optimize radiative noise interface by providing main clock modulation (and modulation of divided portions of the main clock with different patterns of modulation (e.g., the low frequency domain DC/DC digital clocks)).

In more specific embodiments, an apparatus includes first circuitry and second circuitry. The apparatus employs circuitry that operates in response to digital clock signal circuitry. The first circuitry and the second circuitry can improve EMC in both high and low frequency domains (e.g., above and below 1 MHz), by spreading dynamic current on both DC/DC switching and digital switching and thus reducing peak currents, thereby facilitating efficiency of clock modulation associated with both modulations of main clock and of a divided portion of the main clock. For example, the first circuitry and second circuitry use the main clock signal to produce the high-frequency digital clock signal and the other low-frequency digital clock signal having independent modulation schemes.

The first circuitry produces a high-frequency digital clock signal characterized by a high frequency which carries radiative noise interference and by a modulated low-frequency digital clock signal characterized by a low frequency modulated by a first type of modulation. In specific embodiments, the first circuitry includes a pseudo-random modulator and a frequency modulation (FM) oscillator that produce the high-frequency digital clock signal as a function of the pseudo-random modulator. For example, the high-frequency digital clock signal is produced as a function of pseudo-random frequency modulation and based on at least four to five percent of the average non-modulated frequency of the main clock and/or at least twelve to sixteen steps.

The second circuitry produces another low-frequency digital clock signal by combining a disparate modulation signal and a feedback signal derived from the other low-frequency digital clock signal. The disparate modulation signal is characterized by modulating the feedback signal via a second type of modulation that is (sufficiently) independent of the first type of modulation and by cancellation and/or blocking of the radiative noise interference manifested by the circuitry operating in response to digital clock signal circuitry (e.g., in the other low-frequency digital clock signal). In various embodiments, the second circuitry includes a triangular modulator and frequency divider circuitry that produces the other low-frequency digital clock signal as a function of the disparate modulation signal.

In a number of specific embodiments, the apparatus further includes additional circuitry. For example, the apparatus includes the circuitry that operates in response to the digital clock signal circuitry. Additionally, the apparatus can further include a power circuit operating by a battery, wherein the power circuit contributes to the radiative noise interference. In various specific embodiments and/or in addition, the apparatus includes a third circuitry the produces an additional low-frequency digital clock signal by combining another disparate modulation signal and another feedback signal derived from the additional low-frequency digital clock signal. The other disparate modulation signal is characterized by modulating the other feedback signal via another type of modulation that is independent of the first type of modulation and by cancellation of the radiative noise interference in the other lower-frequency digital clock signal as produced by the third circuitry.

Other specific embodiments are directed to methods of using the above-described apparatus, such as methods involving an apparatus employing circuitry operating in response to digital clock signal circuitry.

Turning now to the figures, FIG. 1 illustrates an example apparatus, in accordance with the present disclosure. Although not illustrated, the apparatus can employ circuitry operating in response to digital clock signal circuitry which can manifest radiative noise interference. In accordance with various embodiments, the apparatus blocks or cancels the radiative noise interference manifested by the circuitry via independent modulation of different frequency digital clock signals. Although not illustrated, the apparatus can further include a power circuit operating by a battery. The power circuit can contribute to the radiative noise interference.

As illustrated, the apparatus includes first circuitry 102 and second circuitry 104 that provide independent clock modulation of a main clock (e.g., clock signal 101 at 42 MHz). The first and second circuitry 102, 104 use the (same) main clock signal to produce a high-frequency digital clock signal and a modulated low-frequency digital clock signal, as well as another modulated low-frequency digital clock with the modulated digital clock signals having independent (e.g., separate) modulation schemes. In various embodiments, the first circuitry 102 and the second circuitry 104 improve EMC in both high and low frequency domains (e.g., above and below 1 MHz), by spreading dynamic current on both DC/DC switching and digital switching, thus reducing peak currents, and thereby facilitating efficiency of clock modulation associated with both modulations of main clock (e.g., system clock 105 and of divided portion of this main clock (e.g., DC/DC clock 109)).

The first circuitry 102 produces a high-frequency digital clock signal, e.g., system clock 105 characterized by a high frequency (e.g., 42 MHz) which carries radiative noise interference and by a modulated low-frequency digital clock signal 103 characterized by a low frequency (e.g., 437.5 kHz) modulated by a first type of modulation. In various embodiments, the first type of modulation includes a pseudo-random modulation. An example of a first type of modulation is illustrated by the graph 113. In specific embodiments, the first circuitry 102 includes a pseudo-random modulator 108 and a frequency modulation (FM) oscillator 110 that produce the high-frequency digital clock signal (e.g., system clock 105 at 42 MHz) as a function of the pseudo-random modulator 108. In further specific embodiments, the first circuitry 102 further includes a frequency divider circuit 106 that is arranged with the pseudo-random modulator 108 to provide the modulated low-frequency digital clock signal 103 characterized by the low frequency (e.g., 437.5 kHz). In more specific embodiments, the high-frequency clock digital clock signal (e.g., system clock 105) and/or the modulated low-frequency digital clock signal 103 is produced as a function of pseudo-random frequency modulation and based on an at least sixteen steps and/or five percent of the average non-modulated frequency of the clock signal 101 (e.g., 42 MHz). Although embodiments are not so limited and can include fewer than sixteen steps, such as twelve steps, and/or different percentages of the average non-modulated frequency of the clock signal 101, such as four percent.

The second circuitry 104 produces another low-frequency digital clock signal (e.g., DC/DC clock 109 at the output port that is at 437.5 kHz) by combining a disparate modulation signal 107 (e.g., output of the triangular modulator 116 as illustrated by the graph 115) and a feedback signal derived from the other low-frequency digital clock signal (e.g., DC/DC clock 109). In specific embodiments, the disparate modulation signal 107 (e.g., at 27.3 KHz) is characterized by modulating the feedback signal via a second type of modulation that is (sufficiently) independent of the first type of modulation to cancel and/or block the radiative noise interference manifested by the circuitry operating in response to digital clock signal circuitry (e.g., in the other low-frequency digital clock signal or the DC/DC clock 109 at 437.5 kHz at the output port as produced by the second circuitry 104). In specific embodiments, the second type of modulation is a triangular modulation. An example of the second type of modulation is illustrated by the graph 115. In further specific embodiments, the second circuitry 104 includes a triangular modulator 116 and frequency divider circuitry 112, 114 that produce the other low-frequency digital clock signal (e.g., the DC/DC clock 109 at 437.5 kHz) as a function of the disparate modulation signal 107 (e.g., at 27.3 kHz as output by the triangular modulator 116). In specific embodiments and/or in addition, the other modulated low-frequency digital clock signal (e.g., DC/DC clock 109) are produced as a function of triangular frequency modulation and based on an at least sixteen steps and/or four percent of the average non-modulated frequency of the clock signal 101 (e.g., 42 MHz). Although embodiments are not so limited and can include different steps, such as fewer or more than sixteen steps, and different percentages of the average non-modulated frequency of the clock signal 101. A specific example of the second type of modulation is illustrated by the graph 115.

In accordance with various embodiments, cancellation and/or blocking of radiative noise interference (e.g., electromagnetic interference (EMI)) at the clock used to drive the logic circuitry (using the related DC power supplies) can be advantageous because: (i) logic circuits can increase in terms of operational switching speed which is controlled by the clock signals including reduction in EMI for DC/DC clocks running in the range of hundreds of kHz (e.g., 437.5 kHz DC/DC clock 109) and well into higher frequencies which get close to and/or include the high-frequency digital clock signal in the Mhz range (e.g., 42 MHz/system clock 105); (ii) operational supply voltages for the logic circuits can decrease (e.g., below 5v and 1.5v and lower); and (iii) logic circuits can be implemented in smaller areas which make isolation of their digital (switching) signals more difficult (e.g., FET and technologies are requiring reduced dielectric separation areas). Accordingly, as described above, the apparatus independently controls modulation of the clock signal to produce a high-frequency digital clock signal (e.g., system clock 105 at 42 MHz) characterized by a high frequency which carries radiative noise interference and a modulated low-frequency digital clock signal characterized by a low frequency (e.g., 437.5 kHz) and another modulated low-frequency digital clock signal (e.g., DC/DC clock 109 at 437.5 KHz). The low-frequency digital clock signal characterized being modulated by a first type of modulation (e.g., pseudo-random) and the other low-frequency digital clock signal (e.g., DC/DC clock 109 at 437.5 KHz) being modulated by a second type of modulation (e.g., triangular).

In various embodiments, the modulation of the other low-frequency digital clock signal (e.g., the DC/DC clock 109) is selectively enabled, as illustrated by the "enabled" signal input to the triangular modulator 116. For one or more embodiments, it may be beneficial to not cancel or block the radiative noise interference and/or to otherwise control when modulation of the other low-frequency digital clock signal occurs. Although embodiments are not so limited, and in various embodiments, the triangular modulator 116 is always enabled such as by the enabled signal input.

FIGS. 2A-2D illustrate an example apparatus and resulting modulation of a digital clock signal, in accordance with the present disclosure. Various embodiments are not limited to first and second circuitry, such as the first and second circuitries 102, 104 illustrated by FIG. 1. FIGS. 2A-2D illustrate an example apparatus having first circuitry 230, second circuitry 232, and third circuitry 234. Similarly to FIG. 1, the apparatus employs circuitry operating in response to digital clock signal circuitry which can manifest radiative noise interference. The apparatus blocks or cancels the radiative noise interference manifested by the circuitry via independent modulation of different frequency digital clock signals. Although not illustrated, the apparatus can further include a power circuit operating by a battery, which can contribute to the radiative noise interference.

Similarly to the apparatus illustrated by FIG. 1, the first circuitry 230 produces a high-frequency digital clock signal 231, e.g., system clock, characterized by a high frequency (e.g., 42 MHz) which carries radiative noise interference and by a modulated low-frequency digital clock signal 227 characterized by a low frequency (e.g., 416.75 kHz) modulated by a first type of modulation. In a number of embodiments, the first type of modulation includes a pseudo-random modulation. An example of a first type of modulation is illustrated by FIG. 2B. In related and more specific embodiments, the first circuitry 230 includes a pseudo-random modulator 238 and an FM oscillator 240 that produces the high-frequency digital clock signal 231 (e.g., system clock at 42M FM) as a function of the pseudo-random modulator 238. The first circuitry 230 can further include a frequency divider circuit 236 that is arranged with the pseudo-random modulator 238 to provide the modulated low-frequency digital clock signal 227 characterized by the low frequency (e.g., 416.75 kHz). For example, the high-frequency digital clock signal 231 and/or the modulated low-frequency digital clock signal 227 are produced as a function of pseudo-random frequency modulation and based on an at least twelve steps and/or four percent of the average non-modulated frequency of the clock signal 225 (e.g., 40 MHz). Although embodiments are not so limited and can include more or fewer than twelve steps, such as ten to twenty steps, and/or different percentages of the average non-modulated frequency of the clock signal 225, such as five percent.

The second circuitry 232, as previously described in connection with FIG. 1, produces another low-frequency digital clock signal (e.g., slow DC/DC clock 233 that is at 416.75 kHz) by combining a disparate modulation signal 229 (e.g., output clock of the triangular modulator 244 illustrated by the graph of FIG. 2C) and a feedback signal derived from the other low-frequency digital clock signal. The disparate modulation signal 229 (e.g., output clock at 27.3 KHz) is characterized by modulating the feedback signal via a second type of modulation that is (sufficiently) independent of the first type of modulation to cancel and/or block the radiative noise interference manifested by the circuitry operating in response to digital clock signal circuitry. In various embodiments, the second type of modulation includes a triangular modulation. An example of the second type of modulation is illustrated by the graph of FIG. 2C. In more specific embodiments, the second circuitry 232 includes a triangular modulator 244 and frequency divider circuitry 242, 246 that produce the other low-frequency digital clock signal (e.g., the slow DC/DC clock 233 at 416.75 kHz) as a function of the disparate modulation signal 229 (e.g., at 27.3 kHz as output by the triangular modulator 244). The other modulated low-frequency digital clock signal (e.g., the slow DC/DC clock 233) is produced as a function of triangular frequency modulation and based on an at least sixteen steps and/or four percent of the average non-modulated frequency of the clock signal 225 (e.g., 40 MHz). Although embodiments are not so limited and can include different steps, such as fewer or more than sixteen steps, and different percentages of the average non-modulated frequency of the clock signal 225.

Figure 2A:
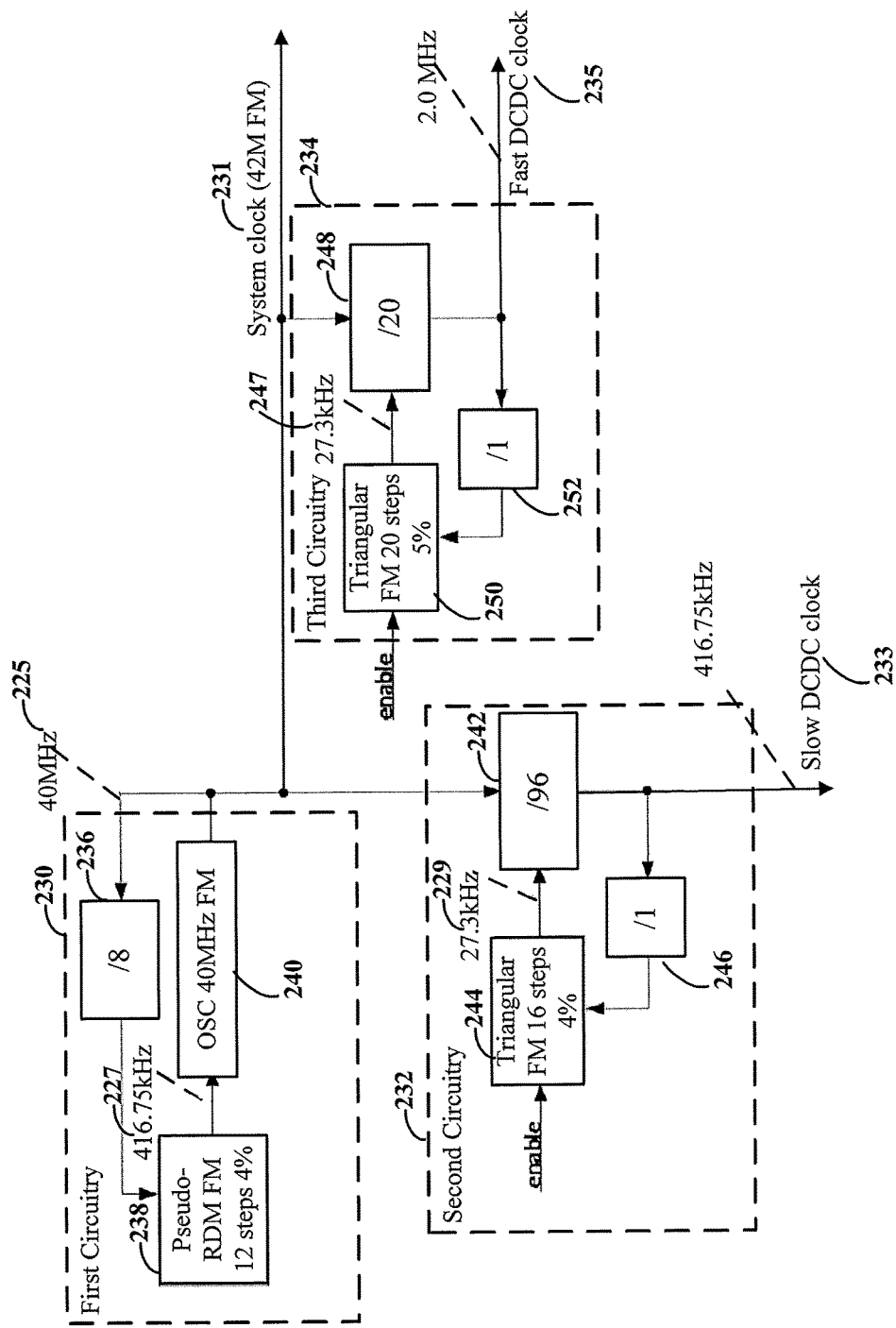
FIGS. 2A-2D illustrate an example apparatus and resulting modulation of a digital clock signal, in accordance with the present disclosure.
Figure 2B:
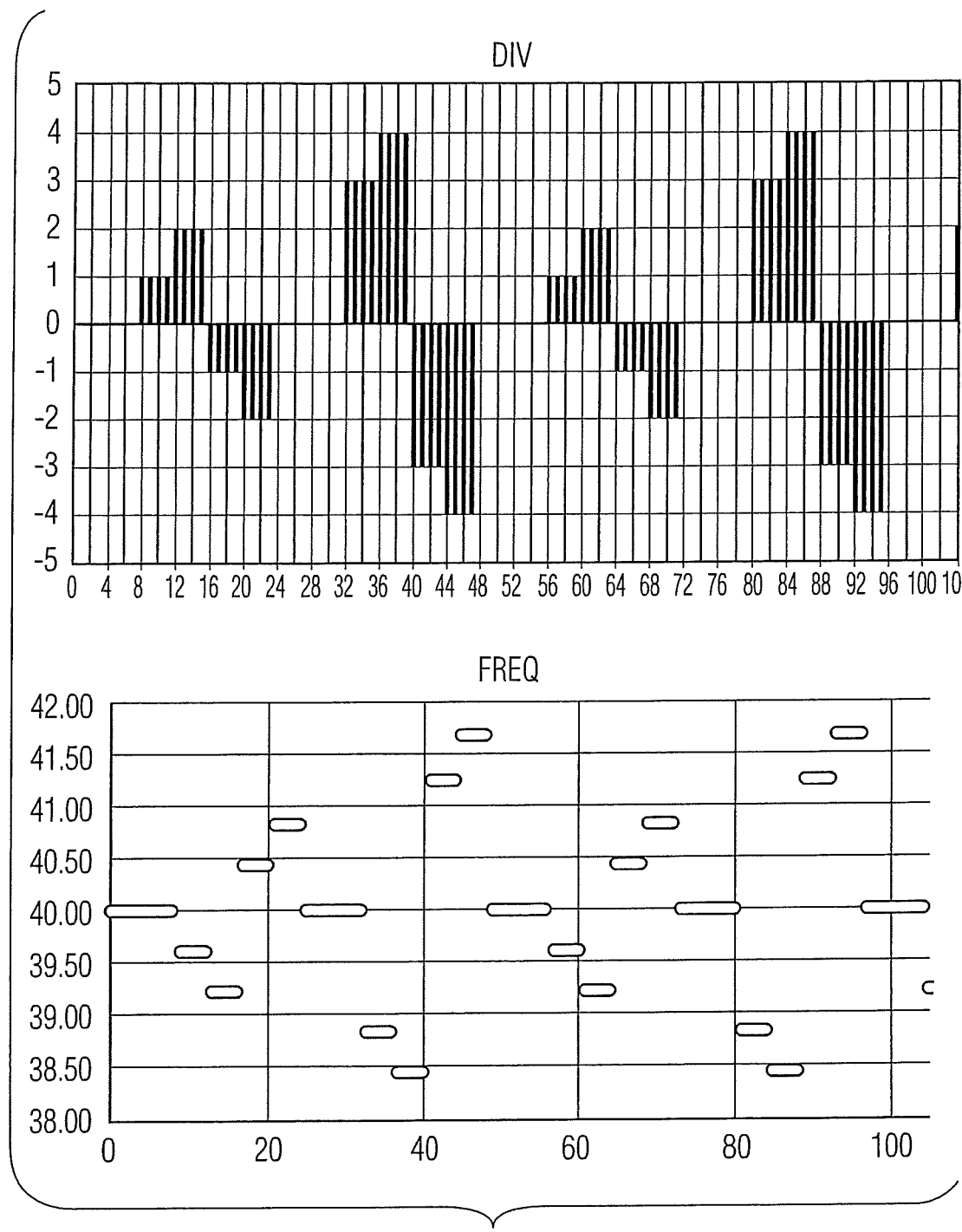
Figure 2C:
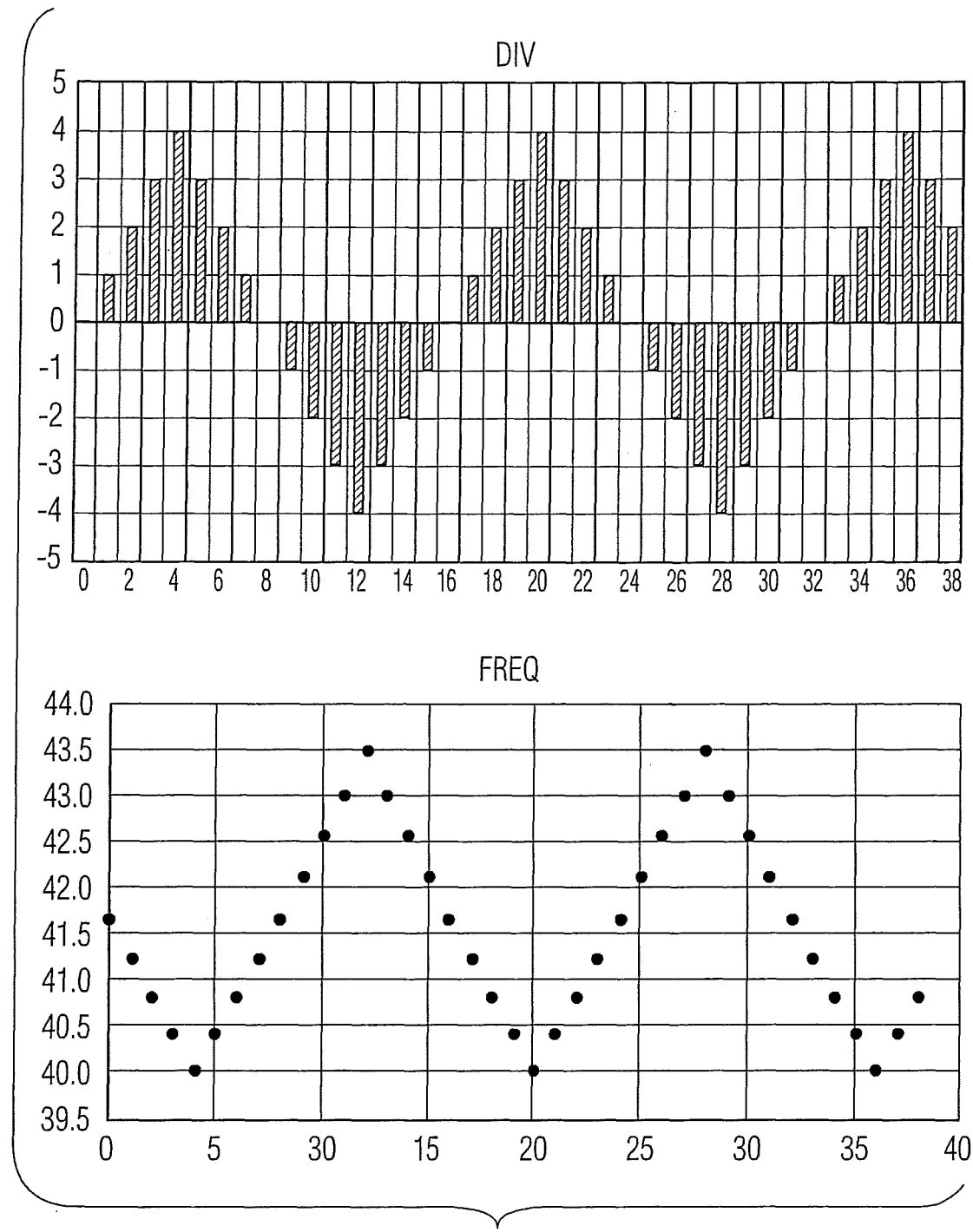
Figure 2D:
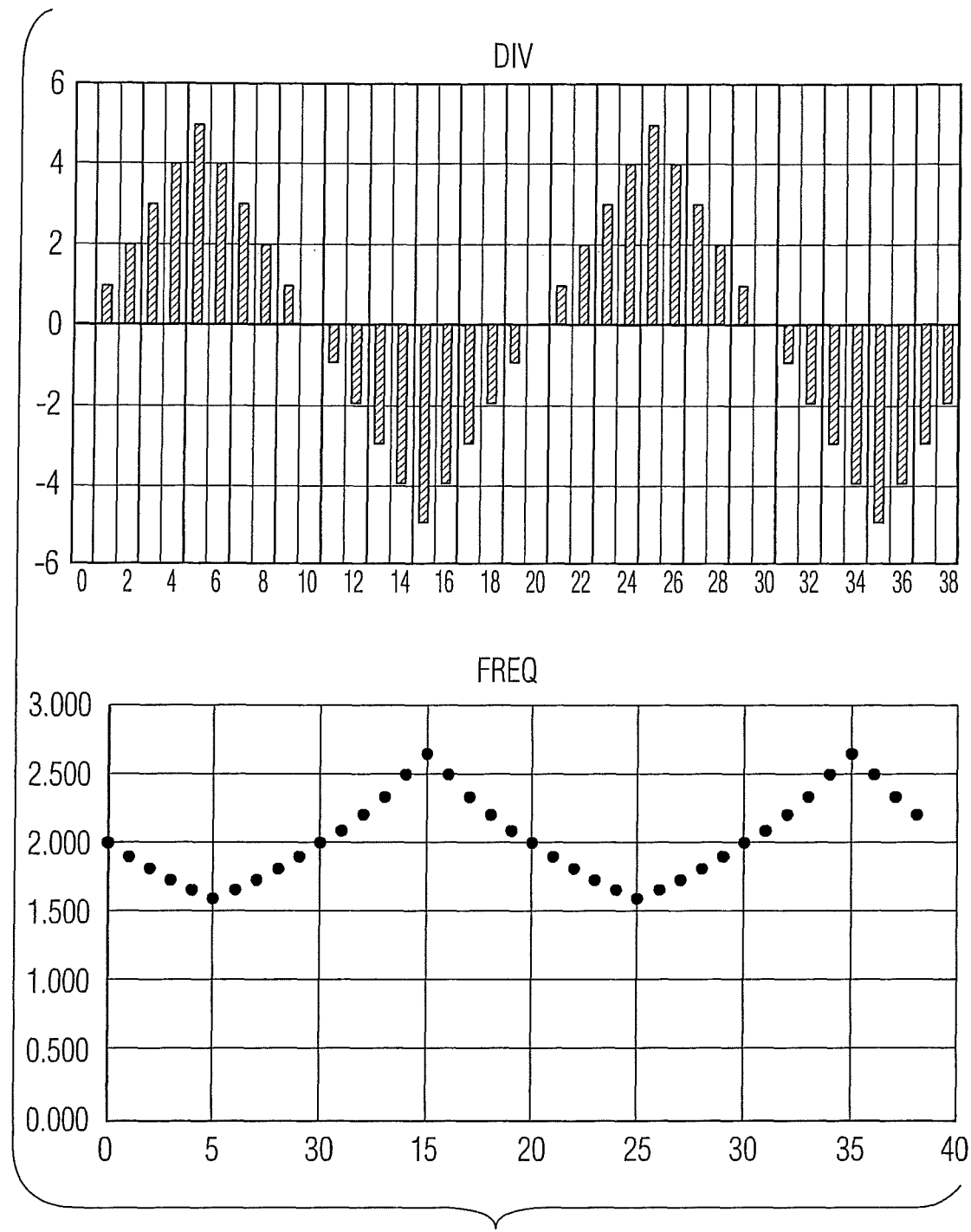

The third circuitry 234 produces an additional low-frequency digital clock signal (e.g., fast DC/DC clock 235 at 2.0 MHz) by combining another disparate modulation signal 247 (e.g., output clock signal of the other triangular modulator 250 illustrated by the graph of FIG. 2D) and another feedback signal derived from the additional low-frequency digital clock signal. The other disparate modulation signal 247 is characterized by modulating the other feedback signal via another type of modulation (e.g., a third type of modulation) that is independent of the first type of modulation (and optionally, the second type of modulation) and provides additional cancellation and/or blocking of the radiative noise interference in the additional low-frequency digital clock signal (e.g., the fast DC/DC clock 235 at 2.0 MHz) as produced by the third circuitry 234.

In a number of embodiments, the third type of modulation includes a triangular FM modulation. An example of the third type of modulation is illustrated by the graph of FIG. 2D. For example, the third circuitry 234 includes another triangular modulator 250 and other frequency divider circuitry 248, 252 that produces the other low-frequency digital clock signal (e.g., the fast DC/DC clock 235 at 2.0 MHz) as a function of the disparate modulation signal low frequency 247 (e.g., at 27.3 kHz as output by the other triangular modulator 250). The additional modulated low-frequency signal (e.g., the fast DC/DC clock 235) is produced as a function of triangular frequency modulation and based on an at least twenty steps and/or five percent of the average non-modulated frequency of the clock signal 225 (e.g., 40 MHz). Although embodiments are not so limited and can include different steps, such as fewer or more than twenty steps, and different percentages of the average non-modulated frequency of the clock signal 225.

Similarly to the apparatus illustrated by FIG. 1, the modulation of the other low-frequency digital clock signal (e.g., the slow DC/DC clock 233) and/or of the additional low-frequency digital clock signal (e.g., the fast DC/DC clock 235) can be selectively enabled (as illustrated by the "enabled" signal input to the triangular modulators 244, 250 of the second and third circuitries 232, 234) such as when the apparatus is in a low power mode. Although embodiments are not so limited, and in various embodiments, one or more of the modulators 244, 250 can always enabled, such as by the enabled signal input.

Figure 3:
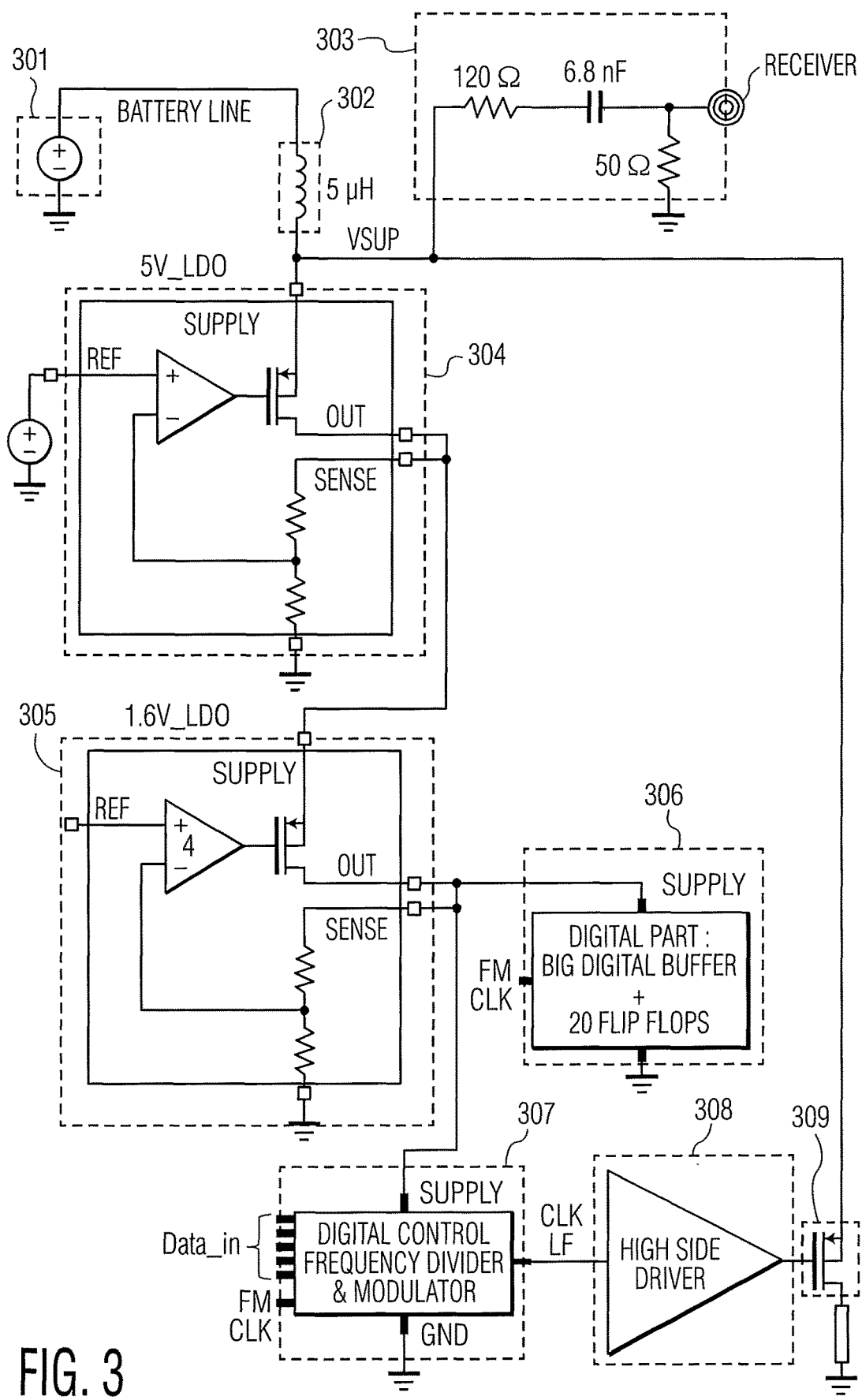
FIG. 3 illustrates a specific example of an apparatus employing circuitry that operates in response to digital clock signal circuitry, in accordance with the present disclosure.

FIG. 3 illustrates a specific example of an apparatus employing circuitry that operates in response to digital clock signal circuitry, in accordance with the present disclosure. More specifically, the apparatus illustrated by FIG. 3 can be used to provide the illustrated cancellation and/or blocking of radiative noise interference, as illustrated further by FIGS. 4A-4C.

In various specific embodiments, a battery line 301 is separated from Vsup (supply of the integrated circuit) by a 5 uH inductor 302. Vsup is supplying a 5V Low Drop Out (LDO) regulator 304 and high side switch 309. The 5V LDO regulator 304 is supplying a high side driver 308 and 1.6V LDO 305. The 1.6 V LDO 305 is supplying digital part 306 (e.g., one relatively large digital clock buffer plus twenty flip flops switched at the system clock frequency) and Digital Control Unit 307 (e.g., digital control frequency divider and modulator) that divides and modulates the low frequency clock as used by the high side driver 308 (Pulse Width Modulation with 50% duty cycle). As also shown, receiver circuitry 303 is coupled to Vsup.

Figure 4A:
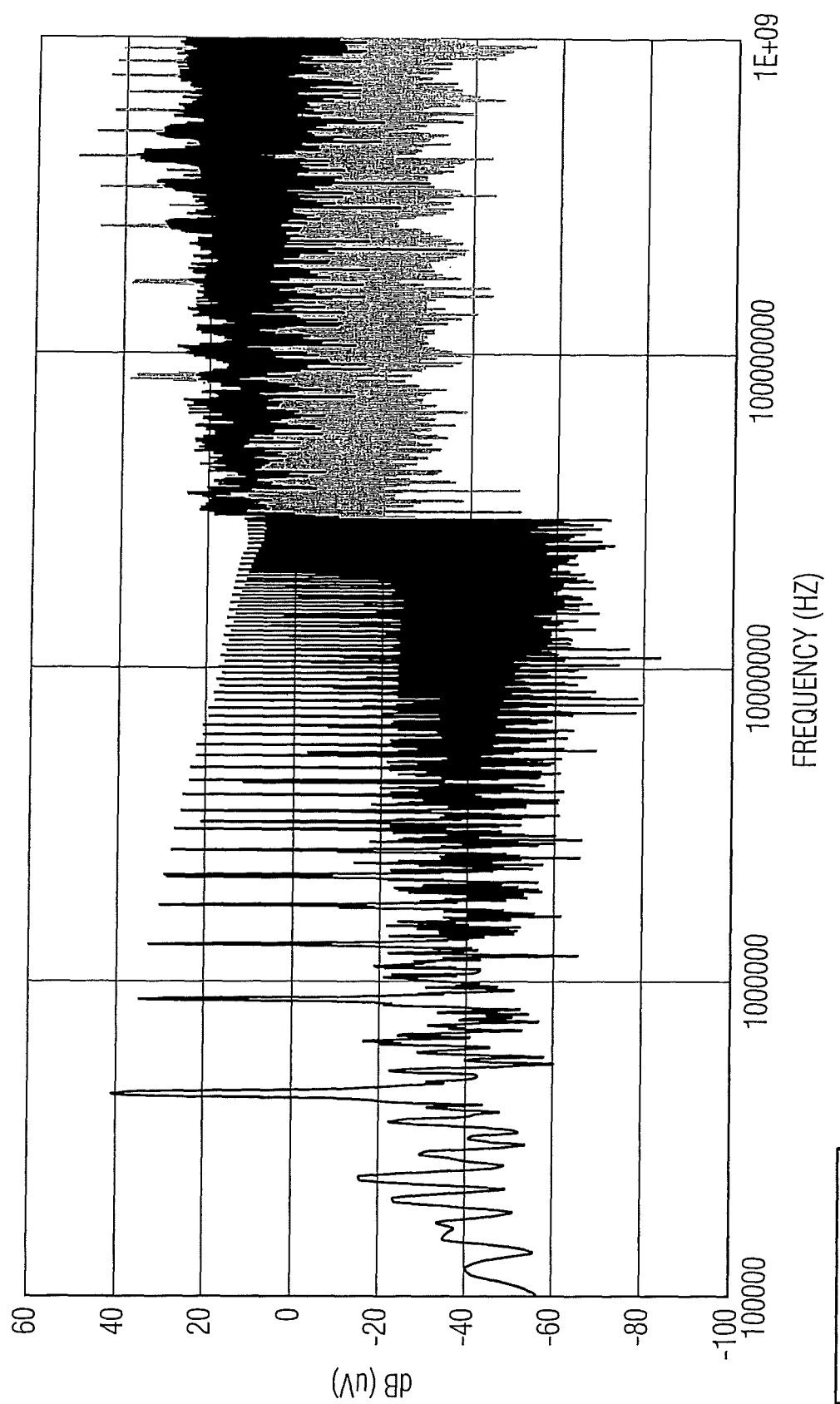
FIGS. 4A-4C illustrate examples of cancellation or blocking of radiative noise interference by apparatuses, in accordance with the present disclosure.
Figure 4B:
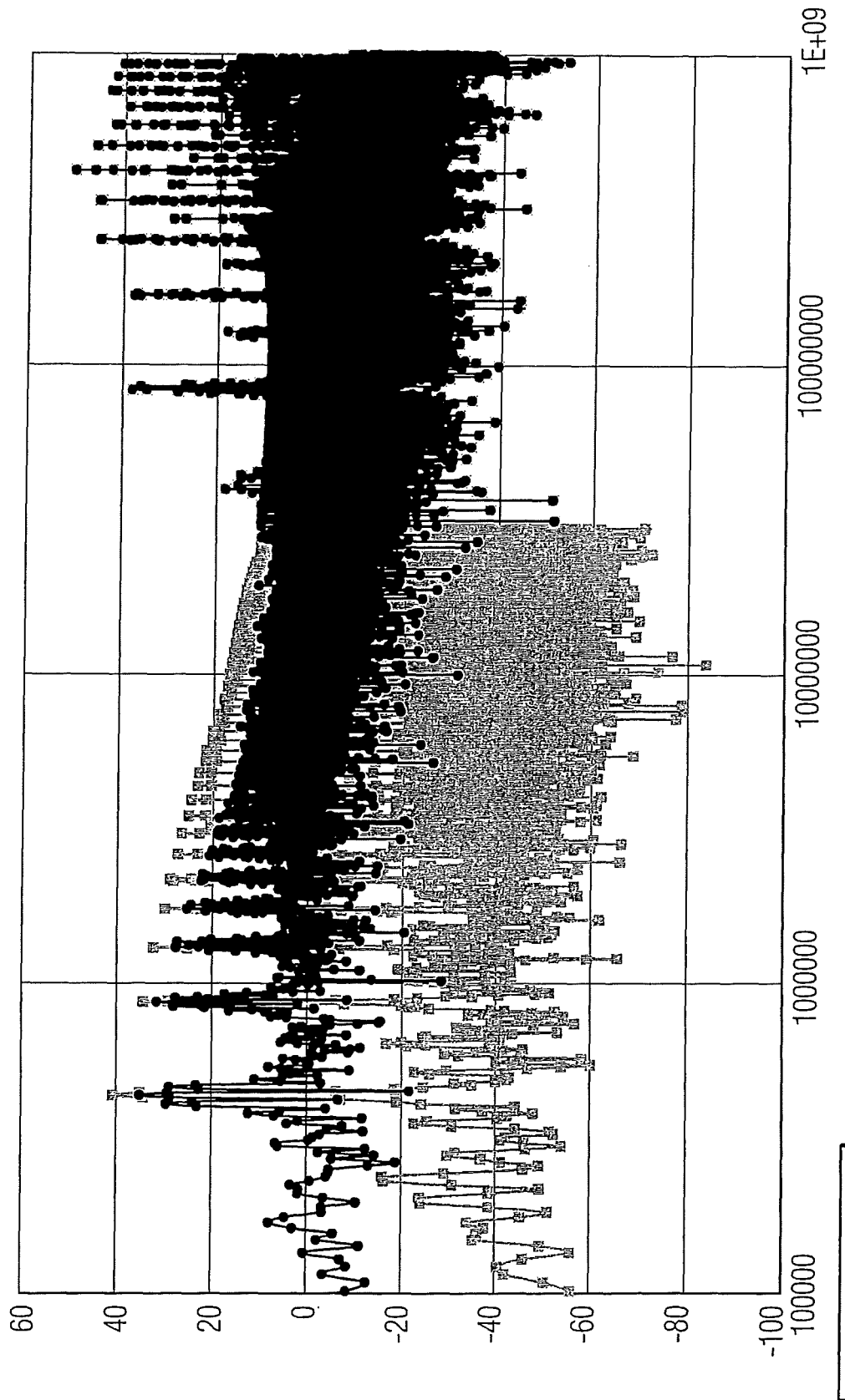
Figure 4C:
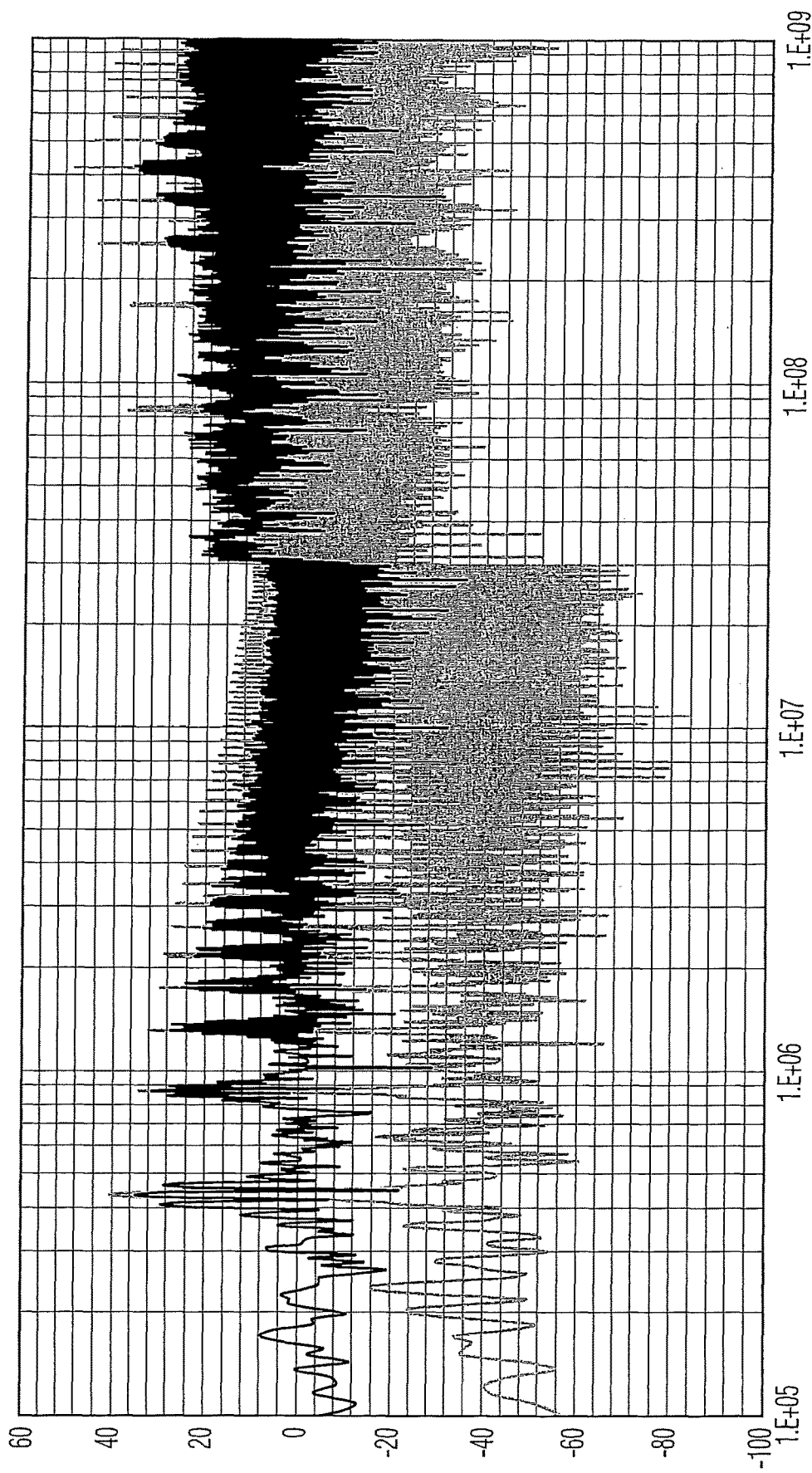

FIGS. 4A-4C illustrate examples of cancellation or blocking of radiative noise interference by apparatuses, in accordance with the present disclosure. More specifically, different example circuits are compared to illustrate resulting battery spectrum analysis. FIGS. 4A-4C illustrate the impact on the battery spectrum caused by noise propagation through supply lines. For example, the apparatus illustrated by FIG. 3 can be generated four times and implemented differently to observed noise propagation through supply lines and the impact on the battery spectrum, referred to as cases. The first case (e.g., case 1), shown in each of FIGS. 4A-4C, illustrates example impacts on the battery spectrum when no FM is performed at 42 MHz or 437 kHz. The second case (e.g., case 2), shown in FIG. 4A, illustrates an example impact on the battery spectrum when FM is performed at 42 MHz and no FM is performed at 437 kHz. The third case (e.g., case 3), shown in FIG. 4B, illustrates an example impact on the battery spectrum when no FM is performed at 42 MHz and FM is performed at 437 kHz in accordance with various apparatuses of the present disclosure. The fourth case (e.g., case 4), shown in FIG. 4C, illustrates an example impact on the battery spectrum when FM is performed at 42 MHz and FM is performed at 437 kHz in accordance with various apparatuses of the present disclosure.

The above-described apparatuses, as illustrated by FIGS. 1, 2A, and 3, can be used to implement a variety of methods involving an apparatus employing circuitry operating in response to digital clock signal circuitry. An example method includes producing, via first circuitry of the apparatus, a high-frequency digital clock signal characterized by a high frequency which carries radiative noise interference and by a modulated low-frequency digital clock signal characterized by a low frequency modulated by a first type of modulation (e.g., pseudo-random FM). The method further includes producing, via second circuitry of the apparatus, another low-frequency digital clock signal (e.g., DC/DC clock at 437.5 kHz) by combining a disparate modulation signal and a feedback signal derived from the other low-frequency digital clock signal, wherein the disparate modulation signal is characterized by modulating the feedback signal via a second type of modulation that is (sufficiently) independent of the first type of modulation and by cancellation/blocking of the radiative noise interference manifested by the circuitry operating in response to the digital clock signal circuitry. As previously described, the other low-frequency digital clock signal is produced as a function of the disparate modulation signal. In a number of specific embodiments, the method further includes producing, by a third circuitry of the apparatus, an additional low-frequency digital clock signal by combining another disparate modulation signal and another feedback signal derived from the additional low-frequency digital clock signal. The other disparate modulation signal is characterized by modulating the other feedback signal via another type of modulation (e.g., a third type of modulation) that is independent of the first and second type of modulation and cancels and/or blocks the radiative noise interference in the additional low-frequency digital clock signal as produced by the third circuitry.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 108 and 116 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1 and 2A. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, circuit components of the apparatus illustrated by FIG. 3 can be used in combination with components of FIGS. 1 and/or 2A. As another example, the modulation illustrated by FIGS. 2B-2D can be implemented via the circuitry illustrated by FIG. 1. Such modifications do not depart from the true spirit and scope of various aspects of the disclosure, including aspects set forth in the claims.

What is claimed is:

1. An apparatus employing circuitry operating in response to digital clock signal circuitry, the apparatus comprising:
   first circuitry configured and arranged to produce a high-frequency digital clock signal characterized by a high frequency which carries radiative noise interference and by a modulated low-frequency digital clock signal characterized by a low frequency modulated by a first type of modulation; and
   second circuitry configured and arranged to produce another low-frequency digital clock signal by combining a disparate modulation signal and a feedback signal derived from the other low-frequency digital clock signal, wherein the disparate modulation signal is characterized by modulating the feedback signal via a second type of modulation that is independent of the first type of modulation and by cancellation or blocking of the radiative noise interference manifested by the circuitry operating in response to the digital clock signal circuitry.

2. The apparatus of claim 1, further including the circuitry configured and arranged to operate in response to the digital clock signal circuitry.

3. The apparatus of claim 1, wherein the first circuitry includes a pseudo-random modulator and includes a frequency modulation (FM) oscillator configured to produce the high-frequency digital clock signal as a function of the pseudo-random modulator.

4. The apparatus of claim 1, wherein the high-frequency digital clock signal is produced as a function of pseudo-random frequency modulation and based on at least four percent of an average non-modulated frequency.

5. The apparatus of claim 1, wherein the first circuitry includes a pseudo-random modulator.

6. The apparatus of claim 1, wherein the second circuitry includes a triangular modulator and frequency divider circuitry configured and arranged to produce the other low-frequency digital clock signal as a function of the disparate modulation signal.

7. The apparatus of claim 1, wherein the first circuitry and second circuitry are configured and arranged to use a main clock signal to produce the high-frequency digital clock signal and the other low-frequency digital clock signal having independent modulation schemes.

8. The apparatus of claim 1, further including a power circuit operating by a battery, wherein the power circuit contributes to the radiative noise interference.

9. The apparatus of claim 1, further including a third circuitry configured and arranged to produce an additional low-frequency digital clock signal by combining another disparate modulation signal and another feedback signal derived from the additional low-frequency digital clock signal, wherein the other disparate modulation signal is characterized by modulating the other feedback signal via another type of modulation that is independent of the first type of modulation and by cancellation of the radiative noise interference in the additional low-frequency digital clock signal as produced by the third circuitry.

10. The apparatus of claim 1, wherein the other type of modulation is independent of the first and second type of modulation.

11. The apparatus of claim 1, wherein the first circuitry and the second circuitry are configured and arranged to improve electromagnetic compatibility (EMC) in both high and low frequency domains by spreading dynamic current on both direct current (DC)/DC switching and digital switching, thereby reducing peak currents and facilitating efficiency of clock modulation associated with modulation of a main clock and modulation of divided portion of the main clock.

12. The apparatus of claim 1, wherein the first circuitry and second circuitry are configured and arranged to provide independent clock modulation of a main clock.

13. A method involving an apparatus employing circuitry operating in response to digital clock signal circuitry, the method comprising:
   producing, via first circuitry of the apparatus, a high-frequency digital clock signal characterized by a high frequency which carries radiative noise interference and by a modulated low-frequency digital clock signal characterized by a low frequency modulated by a first type of modulation; and
   producing, via second circuitry of the apparatus, another low-frequency digital clock signal by combining a disparate modulation signal and a feedback signal derived from the other low-frequency digital clock signal, wherein the disparate modulation signal is characterized by modulating the feedback signal via a second type of modulation that is independent of the first type of modulation and by cancellation or blocking of the radiative noise interference manifested by the circuitry operating in response to the digital clock signal circuitry.

14. The method of claim 13, further including producing the other low-frequency digital clock signal as a function of the disparate modulation signal.

15. The method of claim 13, further including producing, via a third circuitry of the apparatus, an additional low-frequency digital clock signal by combining another disparate modulation signal and another feedback signal derived from the additional low-frequency digital clock signal, wherein the other disparate modulation signal is characterized by modulating the other feedback signal via another type of modulation that is independent of the first type of modulation and by cancellation or blocking of the radiative noise interference in the other low-frequency digital clock signal as produced by the third circuitry.

16. The method of claim 13, further including producing, via a third circuitry of the apparatus, an additional low-frequency digital clock signal by combining another disparate modulation signal and another feedback signal derived from the additional low-frequency digital clock signal, wherein the other disparate modulation signal is characterized by modulating the other feedback signal via another type of modulation that is independent of both the first type of modulation and the second type of modulation and by cancellation or blocking of the radiative noise interference in the other low-frequency digital clock signal as produced by the third circuitry.

17. The method of claim 13, further including spreading dynamic current on both direct current (DC)/DC switching and digital switching, thereby facilitating efficiency of clock modulation associated with both modulations of a main clock and modulation of divided portion of the main clock.

18. The method of claim 13, wherein the first circuitry includes a pseudo-random modulator and a frequency modulation (FM) oscillator, the method including producing the high-frequency digital clock signal, via the FM oscillator, as a function of the pseudo-random modulator.

19. The method of claim 13, wherein the second circuitry includes a triangular modulator and frequency divider circuitry, the method including producing the other low-frequency digital clock signal as a function of the disparate modulation signal using the triangular modular and frequency divider circuitry.

20. The method of claim 13, further including using, via the first circuitry and the second circuitry, a main clock signal to produce the high-frequency digital clock signal and the other low-frequency digital clock signal having independent modulation schemes.

* * * * *